US007005871B1

(12) United States Patent
Davies et al.

(10) Patent No.: US 7,005,871 B1
(45) Date of Patent: Feb. 28, 2006

(54) APPARATUS, SYSTEM, AND METHOD FOR MANAGING AGING OF AN INTEGRATED CIRCUIT

(75) Inventors: Carl W. Davies, Athens, OH (US); Brian M Kelleher, Palo Alto, CA (US)

(73) Assignee: Nvidia Corporation, Santa Clara, CA (US)

( * ) Notice: Subject to any disclaimer, the term of this patent is extended or adjusted under 35 U.S.C. 154(b) by 0 days.

(21) Appl. No.: 10/882,140

(22) Filed: Jun. 29, 2004

(51) Int. Cl.
*G01R 31/02* (2006.01)

(52) U.S. Cl. .................. 324/763; 324/765; 324/158.1; 345/519

(58) Field of Classification Search ................ 324/760, 324/763, 765, 158.1; 345/503, 506, 519; 348/51, 87, 126, 191
See application file for complete search history.

(56) References Cited

U.S. PATENT DOCUMENTS 5,719,800 A * 2/1998 Mittal et al. ................ 713/321
6,282,625 B1 * 8/2001 Porterfield .................. 711/206
6,359,624 B1 * 3/2002 Kunimatsu .................. 345/503

* cited by examiner

*Primary Examiner*—Minh N. Tang
(74) *Attorney, Agent, or Firm*—Cooley Godward LLP

(57) ABSTRACT

An integrated circuit includes an accelerated aging circuit block that has at least one circuit that ages at a faster rate than a functional circuit block. The accelerated aging circuit block is monitored during normal operation of the integrated circuit. Changes in the accelerated aging circuit block are used to generate data indicative of an aging trend for the functional circuit block.

20 Claims, 6 Drawing Sheets

APPARATUS, SYSTEM, AND METHOD FOR MANAGING AGING OF AN INTEGRATED CIRCUIT

FIELD OF THE INVENTION

The present invention is generally related to generating an indicator signal indicative of deleterious aging of an integrated circuit. More particularly, the present invention is directed towards techniques to monitor and manage the aging of an integrated circuit.

BACKGROUND OF THE INVENTION

The lifetime of an Integrated Circuit (IC) is important in a variety of applications. In consumer products, for example, it is desirable that an IC has a minimum functional lifetime.

The aging characteristics of ICs depend upon a variety of factors. These include device fabrication attributes, environmental conditions, and operating parameters. Device fabrication attributes include aspects of the IC fabrication process that influence aging. Environmental conditions include the ambient temperature when the IC is operated, which in turn may determine the chip temperature. Functional parameters include, for example, on-chip voltages.

A conventional approach to calculating an expected lifetime of an IC is to stress test a small number of ICs in order to generate data on IC degradation and failure rates for other ICs fabricated using a similar process. As an illustrative example, a microprocessor manufacturer may use statistical techniques to calculate an expected minimum lifetime for each microprocessor fabricated from the same process. A set of microprocessors are selected as test samples. The test samples are operated at an elevated temperature to accelerate the aging process. Data on failure rates of the stress-tested microprocessors is then used to calculate the expected lifetime for other microprocessors fabricated using the same fabrication process.

The conventional approach to calculating an expected lifetime of an IC has several drawbacks. One drawback is that after initial sample data is collected, the accuracy of the estimation depends upon maintaining a constant fabrication process. However, fabrication processes may vary for different ICs. For example, some companies may use more than one fabrication facility to manufacture their ICs, and each fabrication facility may use a slightly different fabrication process. Additionally, fabrication processes may change over time, such as when processes are upgraded. As a result, process variance may degrade the accuracy of a lifetime estimate of an IC.

Another drawback of conventional approaches to calculating an expected lifetime of an IC is that the environmental conditions in which an IC is operated may vary. Since the lifetime of an IC decreases with increasing operating temperature, environmental conditions can alter the aging characteristics. In particular, the operating temperature of an IC depends upon the ambient temperature in its local environment and upon the degree to which it is cooled. For example, the use of a heat sink and aggressive cooling (e.g., a high speed fan) may reduce the operating temperature of an IC. In contrast, operating an IC with minimal cooling or in a hot environment may increase the operating temperature of the IC and hence reduce its lifetime.

Still another drawback of conventional approaches to calculating an expected lifetime of an IC is that some types of ICs have more than one possible operating state. As an example, some types of ICs have high performance and low performance operating states. These may include, for example, two or more clock rates, such as a minimum clock rate and one or more higher clock rates for higher performance. Increasing clock rates for higher performance is also known as “overclocking.” The overclocking states typically have a higher operating voltage. The higher voltage and higher heat dissipation experienced during overclocking reduces IC lifetime.

A further complication to calculating an expected lifetime of an IC is the interaction of processing variations, environmental conditions, and overclocking. For example, a particular fabrication process may cause a variation in operating temperature with respect to a baseline process. Environmental conditions add an additional variance to the operating temperature. Overclocking, which increases heat dissipation, adds still yet another variance. As a result, the cumulative variance in expected lifetime of an IC may be higher than desired.

Therefore, what is desired is an apparatus, system, and method for managing the aging of an integrated circuit.

SUMMARY OF THE INVENTION

An apparatus, system, and method for providing an early indication of integrated circuit aging trends during operation of an integrated circuit are described. An integrated circuit includes a functional circuit block and an accelerated aging block. The accelerated aging block includes at least one accelerated aging circuit that ages at a faster rate than the functional circuit block. A performance monitor monitors changes in the accelerated aging circuit block indicative of an aging trend for the functional circuit block.

In one embodiment, detection of an aging trend is used to modify an operating parameter of the integrated circuit. In one embodiment, in response to detecting an unfavorable aging trend, such as greater than expected aging of one or more accelerated aging circuits, an operating parameter is adjusted to reduce the aging rate of the integrated circuit.

In one embodiment, the integrated circuit is a graphics processing unit that permits overclocking. In this embodiment, the performance monitor monitors changes in the accelerated aging circuit block indicative of an unfavorable aging trend for the graphics processing unit. Upon detecting an aging indicator indicating greater than expected future aging of the graphics processor, the overclocking parameter are adjusted to reduce the aging rate of the graphics processing unit.

BRIEF DESCRIPTION OF THE FIGURES

The invention is more fully appreciated in connection with the following detailed description taken in conjunction with the accompanying drawings, in which.

Like reference numerals refer to corresponding parts throughout the several views of the drawings.

DETAILED DESCRIPTION OF THE INVENTION

Figure 1:
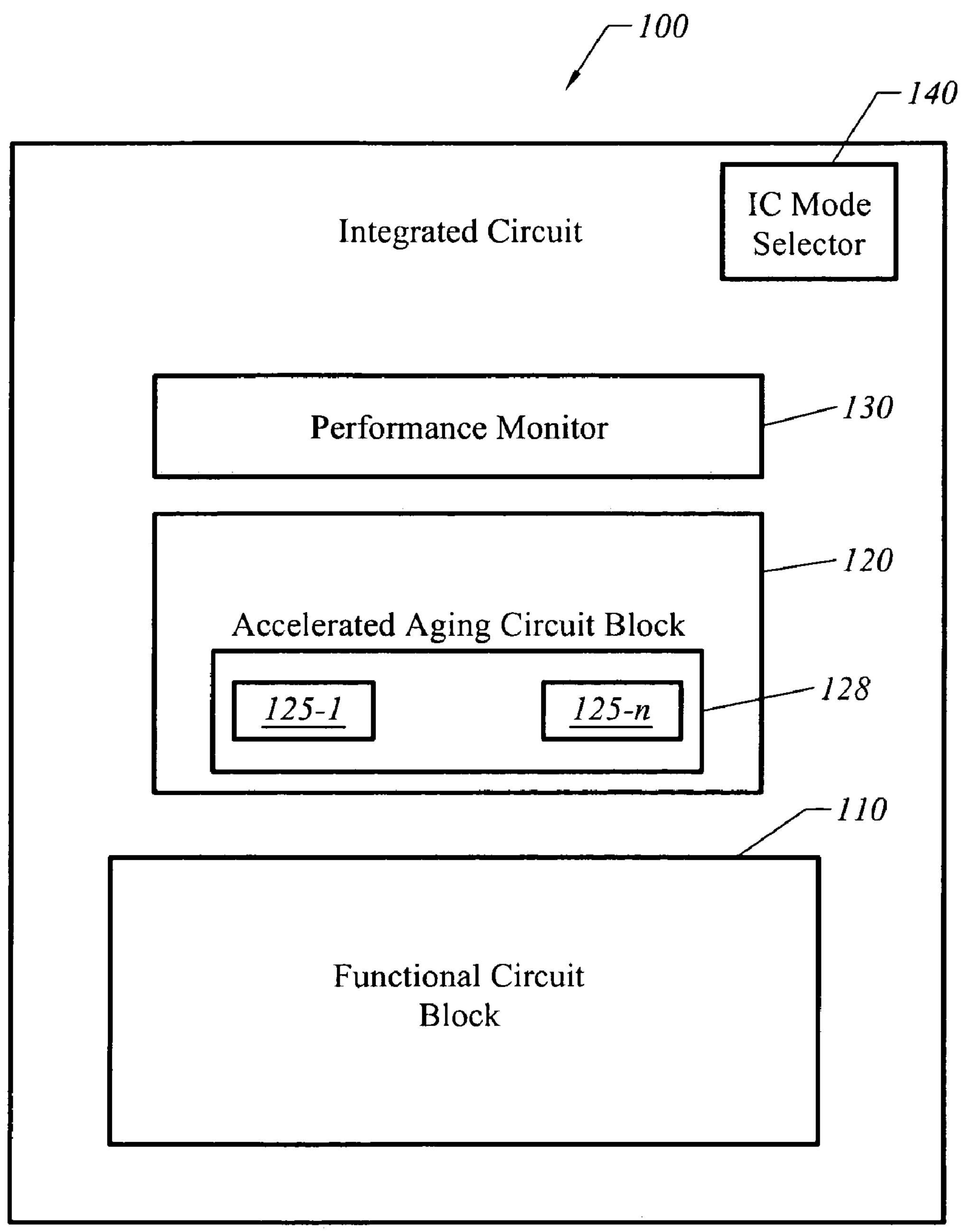
FIG. 1 is a block diagram of an integrated circuit generating an aging indicator in accordance with one embodiment of the present invention.

FIG. 1 is a block diagram of an integrated circuit 100 in accordance with one embodiment of the present invention. Integrated circuit 100 includes a first circuit block corresponding to a functional circuit block 110 of integrated circuit 100. Functional circuit block 110 may, in some embodiments, correspond to part or all of the circuits used to provide the input/output function of integrated circuit 100, such as data processing and management functions. Examples of a functional circuit block include microprocessor circuits, central processing units (CPUs), application specific integrated circuits (ASICs), digital signal processors, coprocessors, and graphics processing units (GPUs).

Integrated circuit 100 includes an accelerated aging circuit block 120. As described below in more detail, accelerated aging circuit block 120 provides an early indication of an aging trend of functional circuit block 110 in light of the previous operation of integrated circuit 100.

Accelerated aging circuit block 120 includes at least one accelerated aging circuit 125. Accelerated aging circuits 125 with identical fabrication and operational characteristics may be arranged in a group 128 having approximately the same acceleration in aging. A single group 128 may be included, although in some embodiments accelerated aging circuit block 120 includes more than one group 128, each having a different aging rate with respect to functional circuit block 110.

Each accelerated aging circuit 125 includes transistors that age at a significantly faster rate than transistors in functional circuit block 110. The aging rate is preferably sufficiently faster than that of transistors in functional circuit block 110 to provide an early warning of premature aging of functional circuit block 110. As an illustrative example, if the aging rate of a group 128 of accelerated aging circuits 125 is a factor of two higher than functional circuit block 110, data from group 128 after two years of operation of the integrated circuit provides an indicator of what the aging behavior of functional circuit block 110 is likely to be like in another two years in the future, assuming constant environmental and operating conditions. If, for example, an integrated circuit is intended to operate for a certain minimum number of years, the aging of groups 128 within accelerated aging circuit block 120 may be used to provide information indicative of the aging trend of functional circuit block 110 in light of previous environmental and operating conditions.

In one embodiment, the aging rate of an accelerated aging circuit 125 is increased by adding a stressor (e.g., voltage, temperature, or other parameter) that is greater than that of functional circuit block 120. The aging of transistors is commonly modeled by an Arrhenius relationship. Thus, to a first order approximation, the aging of the transistors within accelerated aging transistor circuits 125 can be modeled as being accelerated by an Arrhenius factor for each stressor, such as an Arrhenius factor for an increased voltage or temperature compared with functional circuit block 110. As one example, each accelerated aging circuit 125 may have a semiconductor fabrication attribute varied to increase its aging rate, such as by selecting a smaller feature size (e.g., gate length) or oxide thickness to increase the aging rate of field effect transistors (FETs) in an accelerated aging circuit 125. As another example, the voltage may be increased in the accelerated aging circuit to a level higher than that of functional circuit block 110. As still yet another example, an accelerated aging circuit 125 may have one or more attributes selected to increase the operating temperature of its circuits compared with functional circuit block 110, such as increasing thermal dissipation and/or reducing thermal conductance of heat from accelerated aging circuit 125.

Each accelerated aging circuit 125 may be any type of circuit that has an output indicative of the aging of an attribute associated with the performance of functional circuit block 110. Functional circuit block 110 may, for example, have a degradation mode in which the degradation of individual transistors degrades an attribute of functional circuit block 110 required to avoid generating data errors. As one example, a variety of functional circuit blocks have timing margins for proper operation along critical paths. The speed of the functional circuit along critical paths is thus an important attribute. The speed of the circuit depends upon the inverse of the propagation delay time along the critical path. If the signal propagation delay time along the critical path of a functional circuit block 110 sufficiently degrades, hard timing failures may result. Consequently, in one embodiment, accelerated aging circuit 125 includes at least one circuit to measure a propagation delay time along a circuit path to provide an indicator of an aging trend for propagation delay times in functional circuit block 110. One example of a circuit that may be used to measure propagation delay time is a ring oscillator.

Accelerated aging circuit block 120 may include an integer number, m, of accelerated aging circuits 125 in each group 128, where m is an integer greater than or equal to 1. Thus, as illustrated in FIG. 1 there can be any integer number of accelerated aging circuits 125 greater than or equal to one, such as accelerated aging circuits 125-1 to **125-*m*, where m is an integer. Increasing the number, m, greater than one improves the statistical nature of data that can be collected but has the drawback of requiring a greater area. In some embodiments, accelerated aging circuit block 120 also includes accelerated aging circuits 125** that act as a baseline, i.e., are not intended to prematurely age.

A performance monitor 130 monitors the aging of accelerated aging circuit block 120. The monitoring may, for example, be performed continuously, periodically, according to a schedule, or on demand in response to a command received by performance monitor 130. For example, in embodiments in which an accelerated aging circuit 125 includes ring oscillators, performance monitor 130 may monitor the speed of the ring oscillators, i.e., a propagation delay time for a signal to propagate around a ring oscillator within each accelerated aging circuit 125.

Performance monitor 130 generates an aging indicator indicative of the aging behavior of functional circuit block 110. The aging indicator may comprise any indicator of an aging trend, such as an aging rate, failure rate, or failure instance data for the accelerated aging circuits 125. Additionally, the aging indicator may include processed data indicative of aging behavior, such as calculations of the effect on estimated lifetime of functional circuit block 110 based upon data observed from accelerated aging circuits 125. For example, an aging indicator may be generated indicating that the expected lifetime of functional circuit block 110 is likely to be greater than expected, on track, or greater than expected in light of the aging behavior for accelerated aging circuits 125. The aging indicator may comprise a data signal transmitted to other units inside integrated circuit 100 or to units outside of integrated circuit 100. Alternatively, the aging indicator may be stored in a memory and read by other units.

Figure 2:
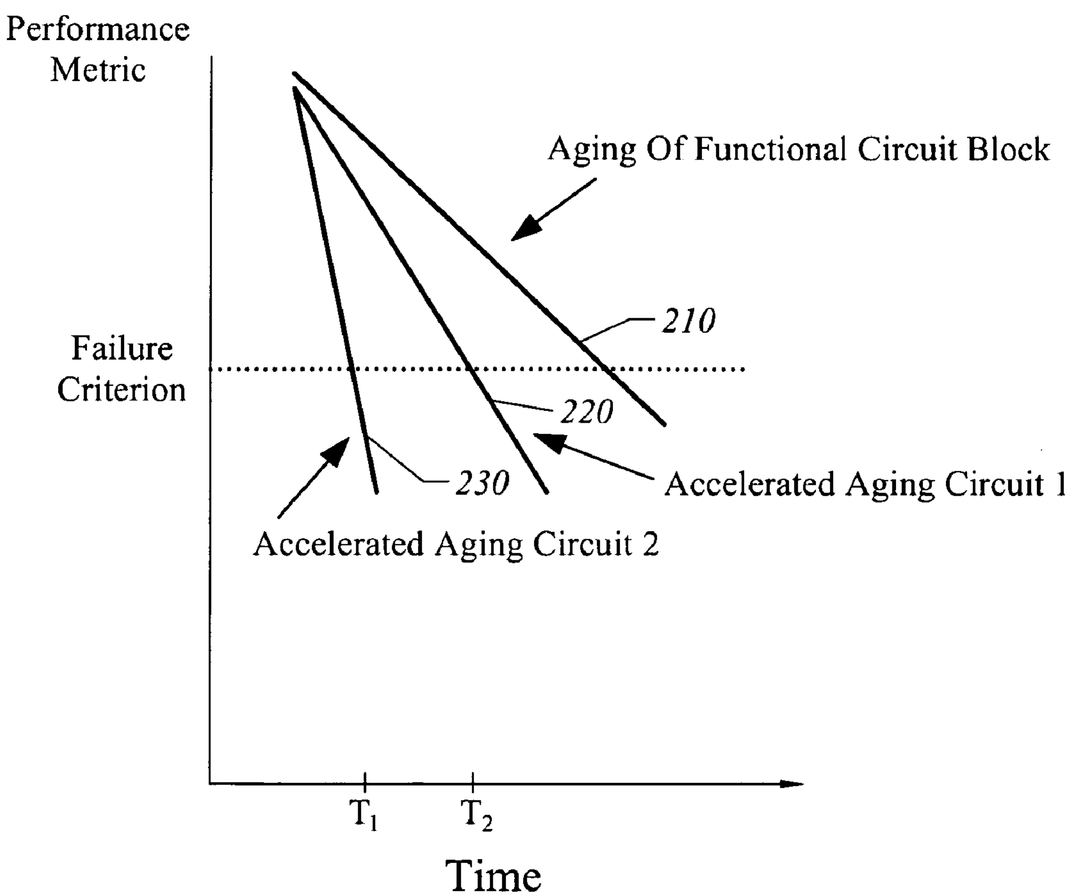
FIG. 2 illustrates the aging of accelerated aging circuit blocks in accordance with one embodiment of the present invention.

FIG. 2 illustrates aging of a portion of functional circuit block 110 and accelerated aging circuits 125. A portion of functional circuit block 110 has a baseline aging characteristic 210 in which an attribute, such as speed, decreases with time. A failure criterion can be defined as a threshold value of a performance metric, such as speed. For example, if a propagation time increases above a threshold value a functional circuit 110 may be at a risk of not operating properly due to timing errors, e.g., the functional circuit 110 becomes too slow with respect to its timing requirements.

The accelerated aging circuits 125 age at a faster rate than functional circuit 110. In some embodiments, the accelerated aging circuits 125 are of a single aging type. However, as illustrated in FIG. 2, the accelerated aging circuit block 120 may also include groups 128 of accelerated aging circuits having two or more different aging characteristics, such as first aging characteristic 220 for a first group 128 of accelerated aging circuits 125 and a second aging characteristic 230 for a second group 128 of accelerated aging circuits 125.

The aging characteristic 230 of the most severely stressed accelerated group 128 of aging circuits 125 provides an early indication of the aging trend of the functional circuit block 110. As an illustrative example, if the stressors of first group 128 of accelerated aging circuits results in rapid aging (e.g., 4 times the aging rate of functional circuit block 110), the failure criterion is reached at time T1. If time T1 is below a preselected value, an early indication of premature aging is obtained, which may be a benefit in some applications. However, for a time beyond time T1, aging characteristic 230 provides no new failure data (since the performance metric is already below the failure criterion). The aging characteristic 220 of a group of accelerated aging circuits with less stress (e.g., twice the aging rate of functional circuit block 110) may be useful to provide an indication of changes in aging behavior for a time between T1 and T2. If time T2 is below a second preselected value, another indication of premature aging is obtained. This may be useful if, for example, environmental or operating conditions change after time T1, such as a decrease in ambient temperature after time T1 that reduces the aging rate of integrated circuit 110.

The number of accelerated aging circuits 125 required in each group 128 will depend, in part, upon the intended use of the output signal of performance monitor 120. For example, if an indicator of possible premature aging of IC 100 is required, only a comparatively small number of accelerated aging circuits 125 may be sufficient such as one accelerated aging circuit 125 in each group 128. However, if greater accuracy is required to predict the future aging behavior, more accelerated aging circuits 125 may be required in each group 128 to obtain a desired degree of statistical accuracy.

In one embodiment, statistical techniques are used to form a correlation between the aging behavior of accelerated aging circuits 125 and functional circuit block 110. This may include using correlation data collected from test wafers to correlate the aging of accelerated aging circuits 125 to functional circuit block 110. Another approach is to monitor both the aging of functional circuit block 110 and accelerated aging circuits 125 over the lifetime of the IC and form a correlation. For example, one or more circuit blocks in IC 100 may have timing circuits configured to permit measurement of a propagation delay time for circuits that form a part of functional circuit block 110. Alternatively, accelerated aging circuit block 120 may include baseline accelerated aging circuits 125 with no stressors to provide a baseline aging characteristic comparable to that of functional circuit block 110.

One application of the present invention is to generate a warning signal of likely future aging of functional circuit block 110 in light of previous environmental and operating conditions. For example, data acquired by performance monitor 130 may be used to generate a signal indicative of premature aging, i.e., aging at a rate faster than expected. For example, in one embodiment if the accelerated aging circuits 125 age at a rate faster than a preselected threshold value (e.g., have a degradation rate greater than a preselected value or a preselected number degrade to the failure criterion before a preselected time), a warning signal is generated to indicate premature aging is likely for functional circuit block 110.

Another application of the present invention is active management of the aging of IC 100. In some embodiments, an IC mode selector 140 is included to adjust the operation of IC 100. IC mode selector 140 may reside all, or in part, on IC 100. However, in an alternate embodiment IC mode selector 140 is disposed outside of IC 100, (e.g., on another IC). IC mode selector 140 selects a mode of operation of IC 100 in response to an aging indicator indicative of the aging behavior of the functional circuit block 110. For example, if an aging indicator signal generated by performance monitor 130 indicates that the functional circuit block 110 is likely to age more rapidly than desired, the operating parameters (e.g., cooling and overclocking) are adjusted to improve the likely lifetime of functional circuit block 100. If the aging indicator indicates that the functional circuit block 110 is aging within an expected range of rates, the operating parameters may be maintained by IC mode selector 140. Conversely, in some embodiments, if the aging indicator indicates that the functional circuit block 110 is aging at a rate below an expected range of rates, more aggressive operating parameters (e.g., less cooling or more overclocking) are selected by IC mode selector 140.

In one embodiment, IC mode selector 140 is adapted to generate a signal to indicate IC cooling requirements (e.g., fan speed). In one embodiment, greater cooling is requested by IC mode selector 140 if data from performance monitor 130 indicates greater than expected aging of functional circuit block 110 is likely. Conversely, less cooling may be requested by IC mode selector 140 if circuit aging data indicates less than expected aging of functional circuit block 110.

In another embodiment, IC mode selector 140 is adapted to permit it to generate a signal to regulate a maximum overclocking clock rate. The maximum overclocking clock rate is reduced if data from performance monitor 130 indicates greater than expected aging of functional circuit block 110. Conversely, a high overclocking rate may be permitted if data from performance monitor 130 indicates less than expected aging of functional circuits 110.

Figure 3:
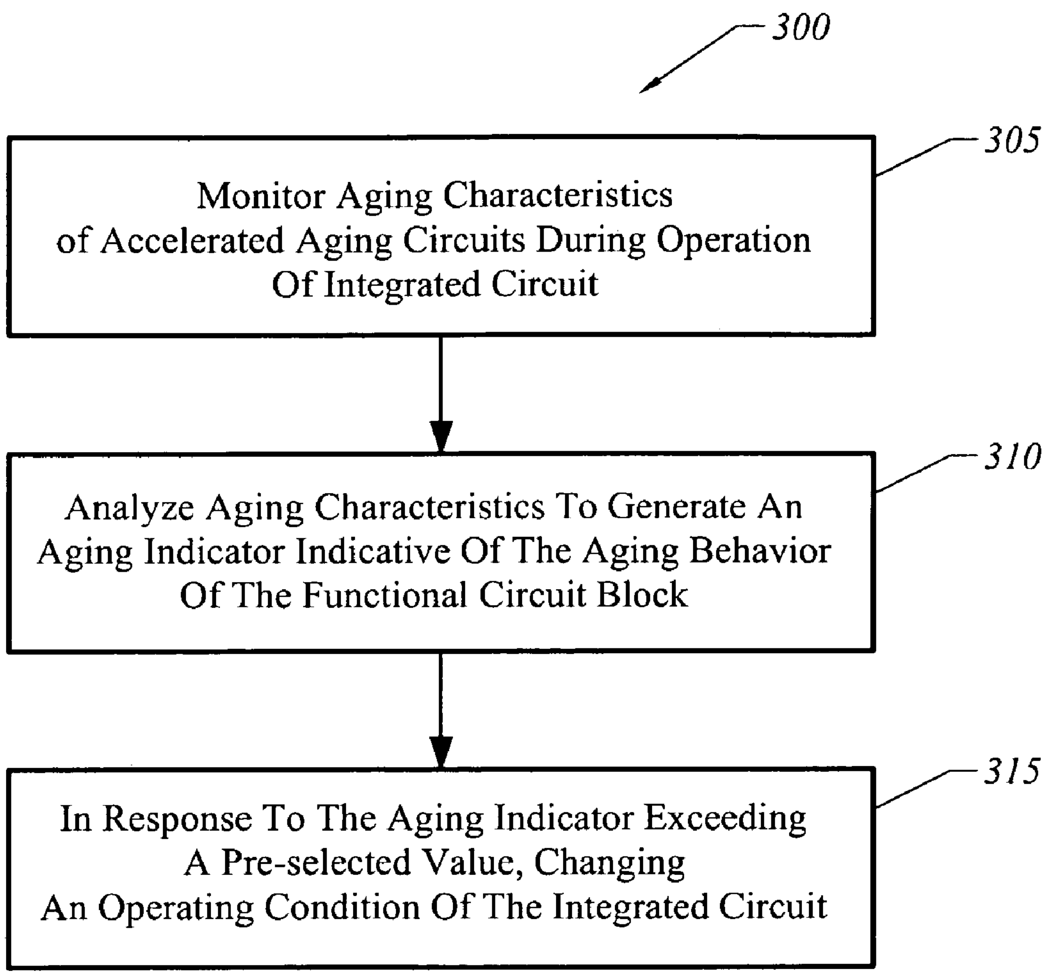
FIG. 3 is a flow chart of a method of adapting the operation of an integrated circuit in response to an aging indicator in accordance with one embodiment of the present invention.

FIG. 3 is a flowchart 300 illustrating a method of managing IC operation in response to aging data of accelerated aging circuits. Aging characteristics of accelerated aging circuits 125 are monitored 305 during operation of integrated circuit 100. The aging behavior is analyzed 310 to generate an aging indicator indicative of the aging behavior of functional circuit block 110. As previously described, the aging indicator may include an aging rate, failure rate, failure instance data, or other indicator of the aging of the functional circuit block 110. If the aging indicator exceeds a pre-selected value, an operating parameter of the integrated circuit is changed 315 to adapt the operation of integrated circuit 100.

Figure 4:
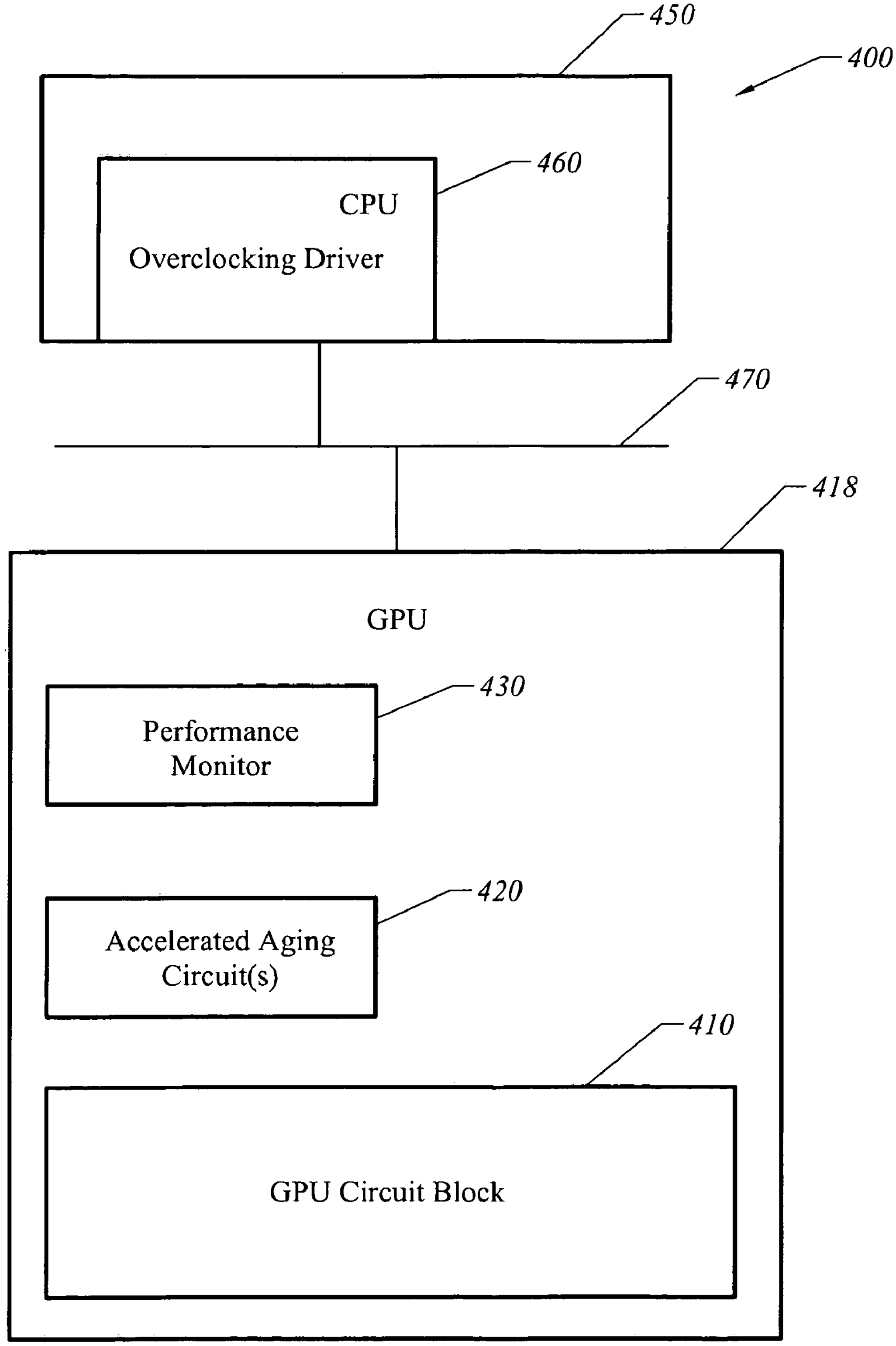
FIG. 4 is a block diagram of a graphics processor unit generating an aging indicator signal in accordance with one embodiment of the present invention.

One application of the present invention is adapting overclocking parameters in a graphics system. FIG. 4 illustrates an exemplary graphics system 400 in accordance with one embodiment of the present invention. Graphics system 400 includes a CPU 450 coupled to a GPU 418 by a bus 470 or a bridge circuit.

CPU 450 includes an overclocking driver 460 to select overclocking parameters for GPU 418. Overclocking driver 460 may also include a user interface for a user to select an overclocking option. In one embodiment, overclocking driver 460 selects a maximum permissible overclocking clock rate.

GPU 418 includes a GPU circuit block 410 for graphics processing. An accelerated aging circuit block 420 includes accelerated aging circuits (not shown) having an output indicative of an attribute related to the performance of GPU circuit block 410. A performance monitor 430 monitors changes in the accelerated aging circuit block 420. Performance monitor 430 provides an aging indicator signal to overclocking driver 460. For example, in some embodiments overclocking driver 460 queries accelerated aging data according to a schedule. The aging indicator signal may be unprocessed performance metric data. Alternatively, the aging indicator signal may be a signal that performance monitor 430 generates by processing data, such as an aging rate of accelerated aging circuits, a threshold aging rate, failure instance data, or a failure rate of accelerated aging circuits.

Figure 5:
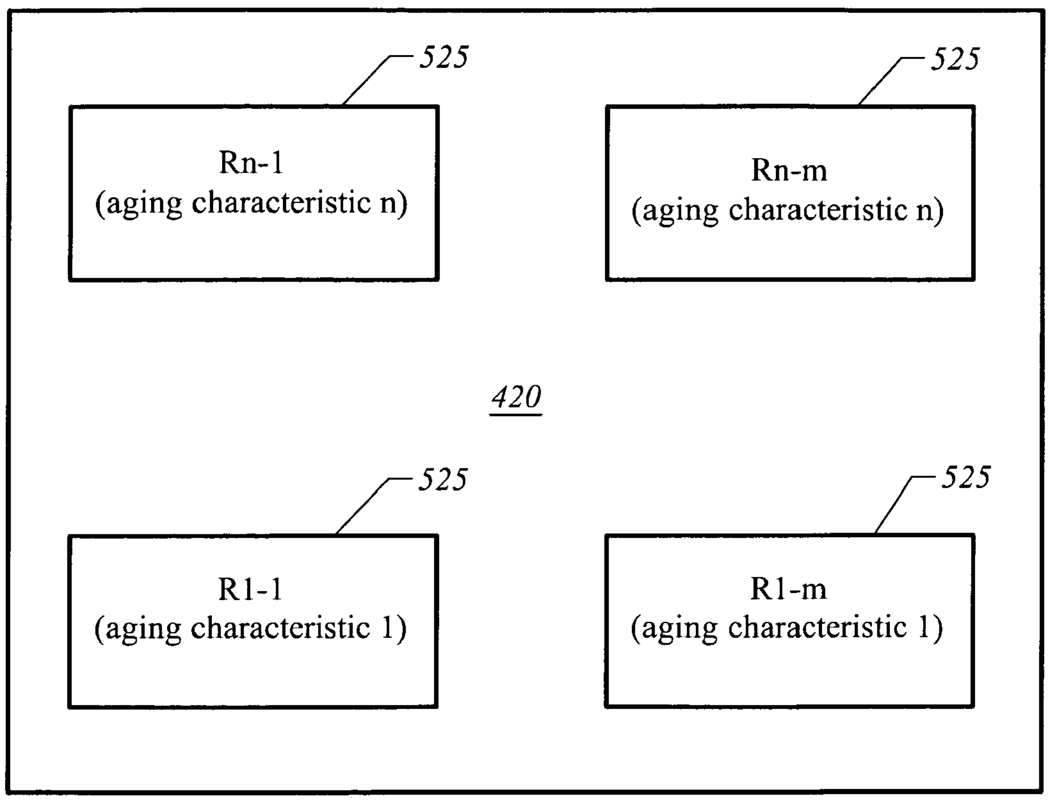
FIG. 5 is a block diagram of an exemplary accelerated aging circuit block in accordance with one embodiment of the present invention.

FIG. 5 illustrates an embodiment of an accelerated aging circuit block 420. Each group of accelerated aging circuits 525 comprises an integer number, m, of ring oscillators Ri to measure circuit propagation times. In some embodiments there are an integer number n, of accelerated aging circuit groups with each group having its own aging characteristic associated with the degree to which it is stressed relative to GPU circuit block 410. In some embodiments one accelerated aging block, such as R1, uses the same baseline transistor parameters at in the GPU circuit block 410 to provide a baseline measurement of (unstressed) aging.

In one embodiment the overclocking driver 460 utilizes the aging indicator signal from performance monitor 430 to determine maximum overclocking parameters, such as a maximum GPU clock rate. In some embodiments, overclocking driver 460 also selects the cooling for a maximum GPU clock rate, such as a minimum fan speed based on the aging indicator signal.

Overclocking increases performance of a graphics system but also decreases the lifetime of GPU 418 due to the increased voltage and heat dissipation associated with overclocking. However, the lifetime of GPU 418 also depends upon a variety of factors, such as ambient temperature, the cooling (e.g., fan speed) used, and the fabrication process used to make GPU 418. Consequently, it is difficult, using conventional techniques, to accurately predict the lifetime of an overclocked GPU 418.

However, in accordance with one embodiment of the present invention overclocking driver 460 reduces the maximum permissible clock rate if the aging indicator indicates that the GPU 418 has an aging trend indicating that the GPU 418 is likely to age more rapidly than desired. For example, the overclocking driver may permit the clock rate to be initially selected at a maximum permissible rate, Cm, in the range between C1 to C2, where C1 is a minimum clock rate and C2 is a maximum value. Suppose that overclocking is selected and GPU 418 operates in an overclocking mode for a period of time at a clock rate of Cm=C2. In one embodiment, if a preselected number of accelerated aging circuits 525 fail before a preselected time, an aging indicator is generated to indicate that it is likely that the current aging trend for GPU 418 corresponds to a premature failure of GPU 418 (e.g., failure before its intended minimum lifetime). In this example, to reduce the chance of a premature failure, the maximum permissible overclocking rate is decreased to a value $C1 \leqq Cm \leqq C2$ to prevent the GPU wearing out before a minimum lifetime. Other parameters, such as cooling, may also be correspondingly adjusted to prevent the GPU wearing out prematurely.

Figure 6:
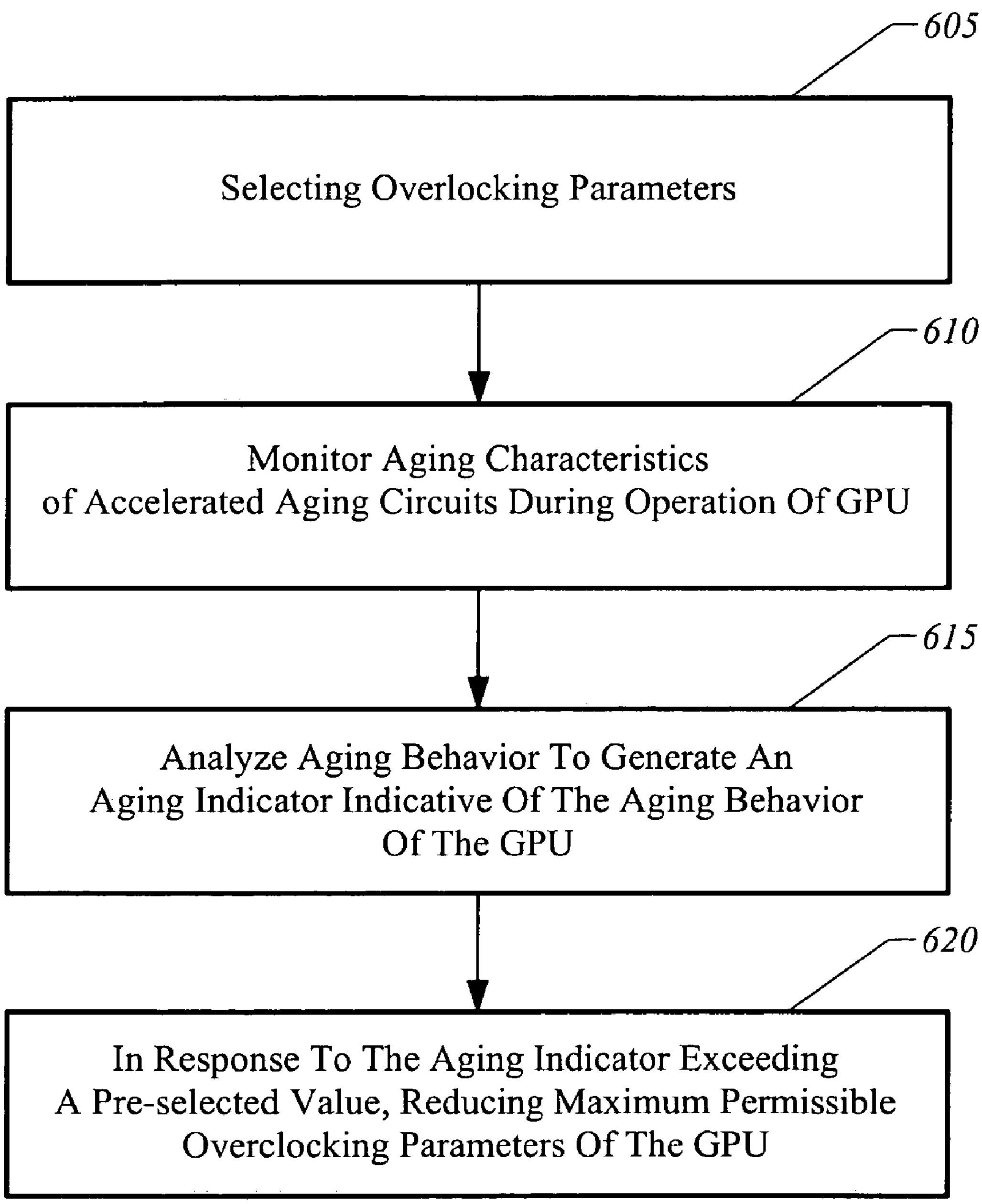
FIG. 6 is a flow chart of a method of adjusting overclocking parameters of a graphics processing unit in response to an aging indicator in accordance with one embodiment of the present invention.

FIG. 6 is a flowchart illustrating a method of operating a GPU 418 in a graphics system 400. Overclocking parameters are initially selected 605. The aging characteristics of accelerated aging circuits 525 are monitored 610 during the operation of the GPU 418. The aging characteristics are analyzed 615 to generate an aging indicator indicative of the aging behavior of the GPU 418. In response to the aging indicator exceeding a pre-selected value, the overclocking driver reduces 620 the maximum permissible overclocking parameters.

One benefit of graphics system 400 is that it permits a user to enjoy the benefits of overclocking while also automatically adapting GPU 418 to adjust the overclocking parameters so that the user also has the benefit of a GPU 418 with an acceptable minimum lifetime. Moreover, because aging trends are measured on-chip during normal use of GPU 418, graphics system 400 also adapts to changes in environmental conditions, such as decreases in lifetime associated with operating GPU 418 in a hot environment or with inadequate cooling.

It will be understood from the previous description that overclocking driver 460 is a software application residing on a memory of CPU 450. The software of overclocking driver 460 may be shipped as part of a CPU 450, shipped on a separate computer readable medium, or downloaded from a computer network onto CPU 450. Consequently, an embodiment of the present invention relates to a computer storage product with a computer-readable medium having computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as optical disks; and hardware devices that are specially configured to store and execute program code, such as application-specific integrated circuits ("ASICs"), programmable logic devices ("PLDs") and ROM and RAM devices. Examples of computer code include machine code, such as produced by a compiler, and files containing higher-level code that are executed by a computer using an interpreter.

The foregoing description, for purposes of explanation, used specific nomenclature to provide a thorough understanding of the invention. However, it will be apparent to one skilled in the art that specific details are not required in order to practice the invention. Thus, the foregoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described in order to best explain the principles of the invention and its practical applications, they thereby enable others skilled in the art to best utilize the invention and various embodiments with various modifications as are suited to the particular use contemplated. It is intended that the following claims and their equivalents define the scope of the invention.

What is claimed is:

1. An integrated circuit, comprising:

a functional circuit block;

an accelerated aging circuit block including at least one circuit aging at a faster rate than said functional circuit block; and a performance monitor adapted to monitor changes of said accelerated aging circuit block indicative of an aging trend of said functional circuit block.

2. The integrated circuit of claim 1, further comprising a mode selector to select an operating parameter of said integrated circuit in response to said performance monitor detecting a change of said at least one circuit indicative of a greater than expected aging rate of said functional circuit block.

3. The integrated circuit of claim 1, wherein said at least one circuit comprises a circuit for generating a propagation delay time and said performance monitor monitors changes in said propagation delay time.

4. The integrated circuit of claim 3, wherein said performance monitor monitors at least one of an aging rate, failure instance, or failure rate of said propagation delay time.

5. The integrated circuit of claim 1, wherein detection of a failure of said at least one circuit before a pre-selected time indicates that said aging trend is an aging trend for premature failure of said functional circuit block.

6. The integrated circuit of claim 1, wherein said functional circuit block comprises a graphics processing unit (GPU).

7. The integrated circuit of claim 6, wherein said performance monitor provides an aging indicator to a central processing unit (CPU), whereby a driver in said CPU adjusts the operation of said GPU to maintain a desired lifetime of said GPU.

8. The integrated circuit of claim 7, wherein said driver selects an overclocking clock rate in response to said aging indicator.

9. The integrated circuit of claim 7, wherein said driver reduces a maximum overclocking clock rate in response to said aging indicator indicating greater than expected aging.

10. The integrated circuit of claim 7, wherein said at least one circuit comprises a circuit for generating a propagation delay time and said performance monitor monitors changes in said propagation delay time.

11. A graphics system, comprising:

a graphics processing unit (GPU) including:

a graphics processing circuit block;

an accelerated aging circuit including at least one circuit aging at a faster rate than said graphics processing circuit block; and a performance monitor to monitor changes of said accelerated aging circuit block indicative of an aging trend for said graphics processing circuit block.

12. The graphics system of claim 11, further comprising:

a central processing unit (CPU) coupled to said GPU;

a driver residing on a memory of said central processing unit;

said driver determining a maximum overclocking clock rate of said GPU in response to an aging indicator received from said performance monitor.

13. The graphics system of claim 11, wherein said accelerated aging circuit block includes at least one circuit adapted to generate a propagation delay time.

14. The graphics system of claim 13, wherein said at least one circuit comprises a ring oscillator.

15. The graphics system of claim 12, wherein said driver selects a maximum overclocking clock rate in response to said aging indicator.

16. The graphics system of claim 12, wherein said driver reduces a maximum overclocking rate in response to said aging indicator signal indicating greater than expected aging.

17. The graphics system of claim 12, wherein said aging indicator signal comprises information on propagation delay time of said propagation delay circuit.

18. A method of operating an integrated circuit, comprising:

monitoring aging in at least one circuit of said integrated circuit having an accelerated aging rate with respect to a functional circuit block; and generating an aging indicator indicative of an aging trend of said functional circuit block.

19. The method of claim 18, further comprising: in response to said aging trend corresponding to a lifetime of said functional circuit block being less than a desired lifetime, changing an operating parameter of said integrated circuit to reduce aging of said functional circuit block.

20. The method of claim 19, wherein said functional circuit block comprises a graphics processing unit and said changing an operating parameter comprises reducing a maximum clock rate.

* * * * *